United States Patent [19]

Iwasaki

[11] Patent Number: 5,260,896
[45] Date of Patent: Nov. 9, 1993

[54] ADAPTIVE FILTER AND A METHOD OF PREVENTING DIVERGENT BEHAVIOR OF THE ADAPTIVE FILTER

[75] Inventor: Motoya Iwasaki, Tokyo, Japan
[73] Assignee: NEC Corporation, Japan
[21] Appl. No.: 794,421
[22] Filed: Nov. 19, 1991

[30] Foreign Application Priority Data
Nov. 20, 1990 [JP] Japan .................. 2-312871

[51] Int. Cl.$^5$ .............................................. G06F 15/31
[52] U.S. Cl. ........................................................ 364/724.19
[58] Field of Search .......................... 364/724.19, 724.2

[56] References Cited

U.S. PATENT DOCUMENTS

| | | | |
|---|---|---|---|
| 4,237,554 | 12/1980 | Gitlin et al. ................ | 364/724.2 |
| 4,243,959 | 1/1981 | Duttweiler .................. | 364/724.19 |
| 4,467,441 | 8/1984 | Gritton ........................ | 364/724.19 |

FOREIGN PATENT DOCUMENTS 0106229 9/1983 European Pat. Off. .
8400260 6/1983 PCT Int'l Appl. .

*Primary Examiner*—David H. Malzahn
*Attorney, Agent, or Firm*—Ostrolenk, Faber, Gerb & Soffen

[57] ABSTRACT

A method of preventing divergent behavior of a recursively adjusted adaptive filter and an adaptive filter to which the method is applied are disclosed. The adaptive filter is adjusted by alternately carrying out two kinds of corrections during respective correction terms. In the first correction term, each tap gain in the adaptive filter is corrected through a recursive correction algorithm. In the second correction term, a new tap gain is produced by multiplying the current tap gain by a constant which is predetermined so as to suppress divergent tendency in recursively corrected values of each tap gain. Therefore, operations to make recursively corrected values of each tap gain converge and operations to suppress divergent tendencies in the recursively corrected values of each tap gain are executed alternately.

9 Claims, 5 Drawing Sheets

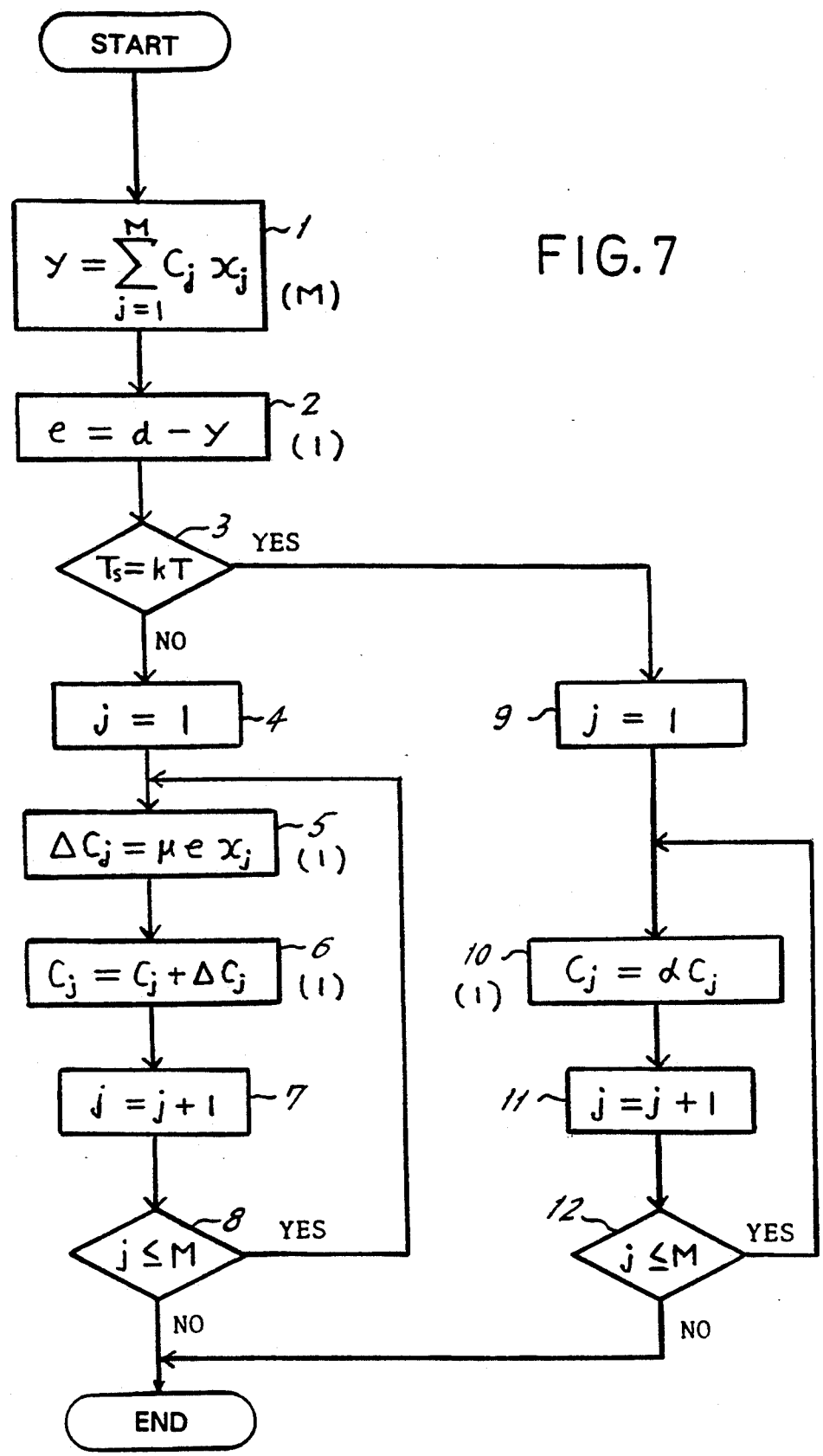

ADAPTIVE FILTER AND A METHOD OF PREVENTING DIVERGENT BEHAVIOR OF THE ADAPTIVE FILTER

BACKGROUND OF THE INVENTION

1. Field of the Invention

The present invention relates to an adaptive filter, in particular a method of preventing divergent behavior of the adaptive filter.

2. Description of the Related Art

Adaptive filters have been widely used in the field of communication, for example in adaptive equalizers in transmission lines and adaptive echo cancellers as well as in the field of signal processing, for example in adaptive noise cancellers, adaptive notch filters and adaptive predictors in voice coding.

A problem encounted in an ordinary adaptive digital filter whose tap gains are adjusted through a recursive correction algorithm has been that convergence of a tap gain is not guaranteed under unstable conditions and a tap gain which has once converged to a certain value tends to diverge again due to noise or other interference.

In order to solve this problem, it has been proposed that "a leak" is imposed on the tap gain in every step of the recursive correction so as to suppress such divergent behavior.

However, in this divergence-suppressing adaptive filter, there is a problem that, since tap gain has to be multiplied by a leak coefficient corresponding to the leak at every recursive correction for each tap, the amount of operation necessary for correcting all tap gains markedly increases due to the multiplication. Further, there is another problem that, since tap output is weighted by tap gain which is multiplied by the leak coefficient, the tap gain of the adaptive filter at the time of converging is likely to reach a value which depends on the leak coefficient and which is not optimum in the sense of the least mean square.

SUMMARY OF THE INVENTION

It is an object of the present invention to provide a method of suppressing divergent behavior in the tap gain of an adaptive filter and allowing the tap gain to converge at an optimum value with fewer operations, thereby solving the problems encountered in prior adaptive filters.

It is another object of the present invention to provide an adaptive filter of recursive correction type capable of suppressing divergent tendencies in the recursively corrected values of each tap gain and allowing the tap gain of the adaptive filter to converge at an optimum value with fewer operations.

In order to achieve the first object, the present invention includes the steps of carrying out a first kind of correction for correcting each tap gain through a recursive correction algorithm during a first correction term; carrying out a second kind of correction during a second correction term by multiplying the tap gain corrected during the preceding first correction term by a constant predetermined so as to suppress divergent tendencies in recursively corrected values of each tap gain; and repeating the first and second kind of corrections successively. The constant is the leak coefficient described above.

By the first kind of correction (hereafter, referred to as the first correction), each tap gain is corrected or adjusted toward the optimum value through a recursive correction algorithm and by the second kind of correction (hereafter, referred to as the second correction), the divergent behavior of each tap gain is suppressed. In this way, the tap gain can be corrected toward the optimum value while the divergent behavior is suppressed.

Since the first correction is a correction through a recursive correction algorithm, it is preferable to make the duration of the first correction term long enough to allow each tap gain to converge at a value substantially close to the optimum value, but short enough to permit the adaptive filter to undergo the second correction before or as soon as the divergent behavior starts. Since the second correction is intended only to impede the start of the divergent behavior of the tap gains, it is preferable to make the duration of the second correction term short, preferably one sampling period. Further, taking into account the purpose of the second correction, the value of the constant or the leak coefficient is a positive value less than 1. Finally, the recursive correction algorithm preferably includes the LMS (Least Mean Square) adaptive algorithm because it is well known in the art. In the LMS adaptive algorithm, since the step size controls the rate of convergence of the mean square error, the duration of the first correction term is preferably determined depending on the step size.

In order to attain the above second object, the adaptive filter according to the present invention includes a correcting circuit for calculating the correcting value of each of the tap gains in accordance with a recursive correction algorithm, an adder, for adding each correcting value calculated by the correcting circuit to a corresponding tap gain, a coefficient multiplier for multiplying the tap gain by a constant predetermined so as to suppress divergent tendencies in recursively corrected values of each tap gain, a selector for selectively outputting one of the signals supplied from both the adder and the coefficient multiplier in response to a selecting signal, and a timer counter for supplying the selecting signal to the selector, wherein the correcting circuit, the adder, the coefficient multiplier and the selector are provided for each of the tap outputs, and a single timer counter is provided for all tap outputs.

The adder outputs a corrected tap gain. The coefficient multiplier outputs a tap gain multiplied by a constant, i.e. the leak coefficient. During the period that the selector is selecting the output of the adder (hereafter, this period is referred to as the first correction term), each tap gain is corrected or adjusted toward the optimum value through a recursive correction algorithm. During the period that the selector is selecting the output of the coefficient multiplier (hereafter this period is referred to as a second correction term), the divergent behavior of the tap gain is suppressed. In this way, even under unstable conditions the tap gain can be corrected toward the optimum value while divergent behavior is suppressed. Hereafter we refer to the corrections made during the first and second correction terms as the first correction and the second correction, respectively.

Since the first correction is a correction through the recursive correction algorithm, it is preferable to determine the duration of the first correction term to be long enough to allow each tap gain to converge at a value substantially close to the optimum value, but short enough to permit the adaptive filter to undergo the second correction before or as soon as the diverging behavior starts. Since the second correction is intended only to impede the start of the divergent behavior of the tap gains, it is preferable to make the duration of the second correction term short, preferably one sampling period. Further, taking into account the purpose of the second correction, the value of the constant is preferably positive and less than 1. Finally, the recursive correction algorithm preferably includes the LMS adaptive algorithm because the algorithm is well known in the art. In the LMS adaptive algorithm, since the step size controls the rate of convergence of the mean square error, the duration of the first correction term is preferably determined depending on the step size.

BRIEF DESCRIPTION OF THE DRAWINGS

FIG. 7 is a flowchart of a signal processing procedure in one sampling period of the adaptive filter shown in FIG. 4.

DETAILED DESCRIPTION OF THE PREFERRED EMBODIMENT

In order to facilitate the understanding of this invention, a conventional adaptive filter will first be described with reference to drawings.

Figure 1:
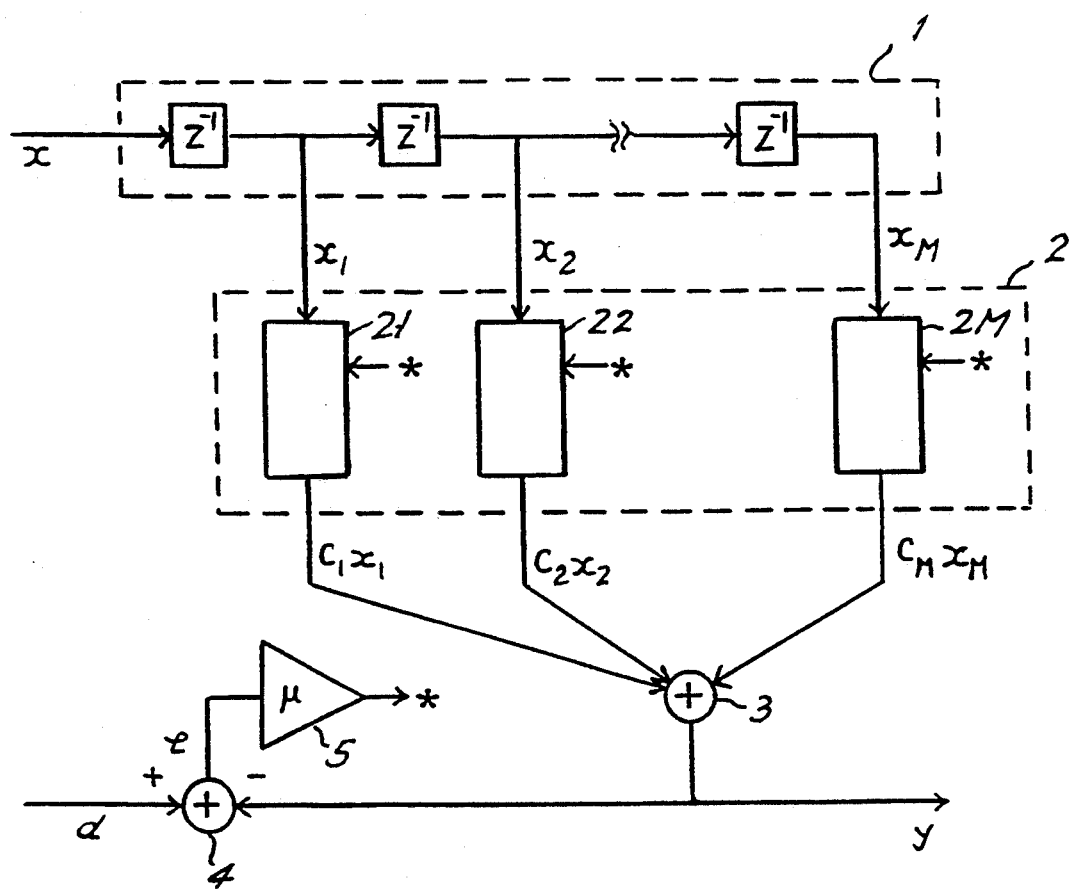
FIG. 1 is a block diagram of a conventional adaptive filter.
Figure 2:
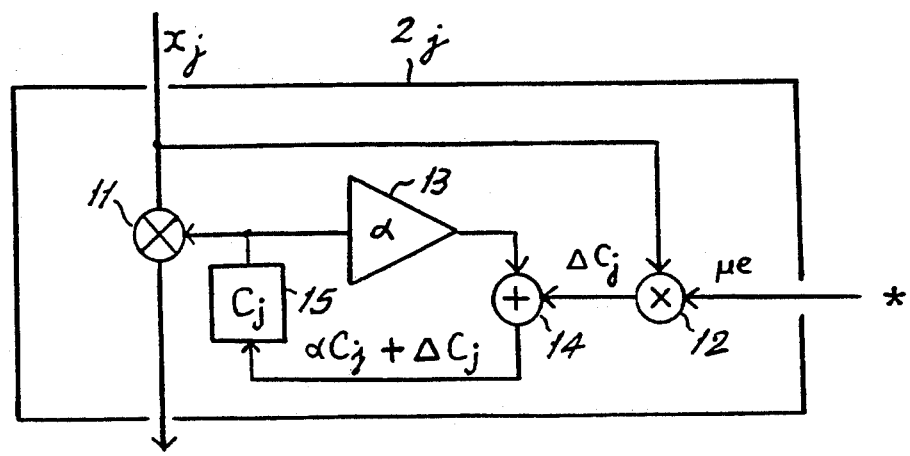
FIG. 2 is a block diagram of a tap gain multiplying unit in the adaptive filter shown in FIG. 1.
Figure 3:
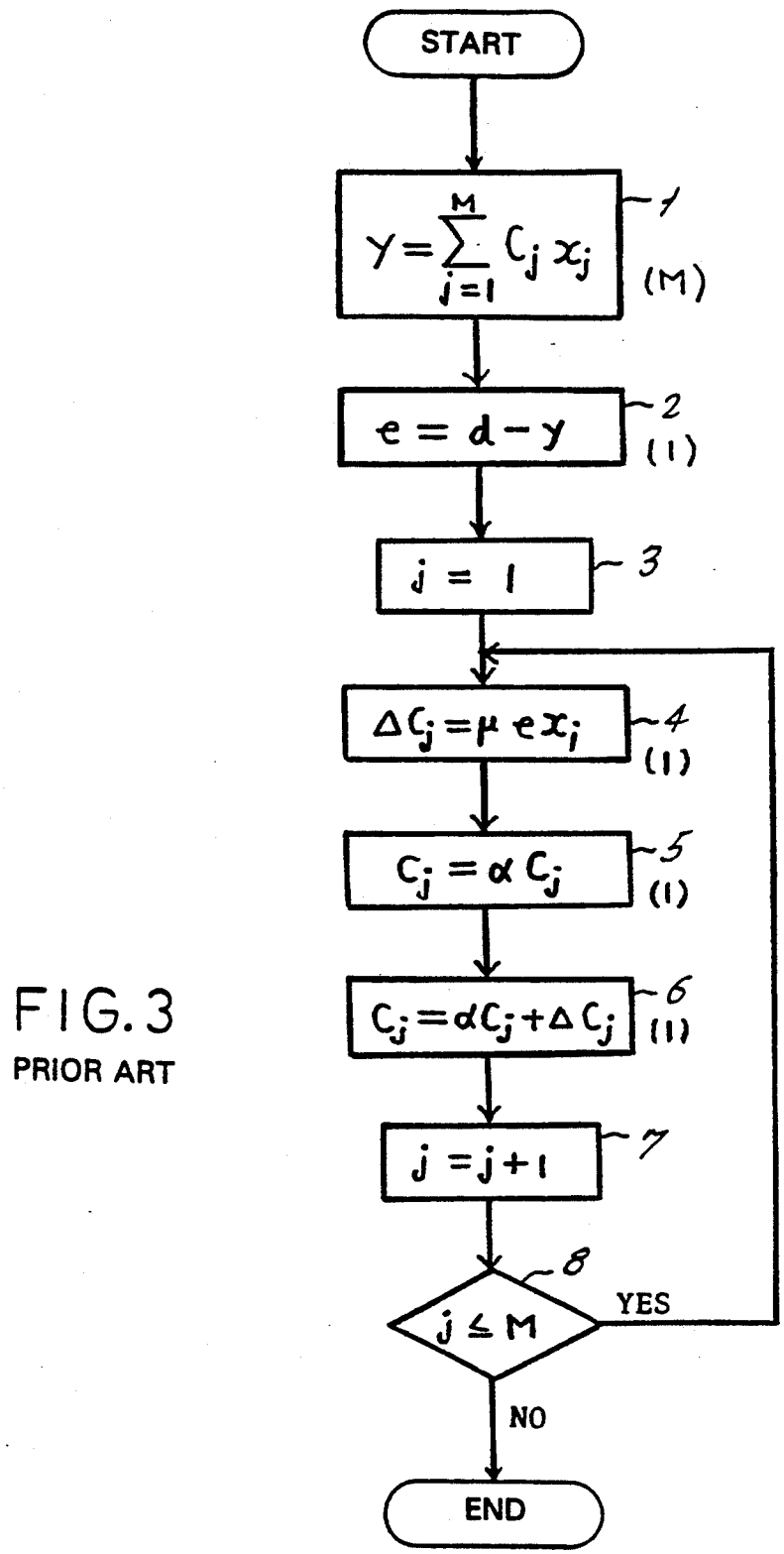
FIG. 3 is a flowchart of a signal processing procedure in one sampling period of the adaptive filter shown in FIG. 1

FIG. 1 is a block diagram of a conventional adaptive filter which has the faculty of suppressing divergent behavior, FIG. 2 is a block diagram of the tap gain multiplying unit $2j$ shown in FIG. 1, and FIG. 3 is a flowchart which represents procedures to correct tap gains during one sampling period in the adaptive filter in FIG. 1.

The adaptive filter in FIG. 1 has the same constitution as the ordinary FIR transversal adaptive filter except for the structure in the tap gain multiplying unit shown in FIG. 2. The adaptive filter includes an M-bit shift register 1 which is equivalent to a delay line with M taps, tap gain multiplying circuit 2 which outputs so-called weighted tap outputs $C_j x_j$ ($j=1, 2, \cdots, M$) by multiplying tap outputs of the delay line $x_j$ ($j=1, 2, \cdots, M$) by corresponding tap gains $C_j$ ($j=1, 2, \cdots, M$), respectively, and an adder 3 for adding the weighted tap outputs $C_j x_j$ over $j=1$ through M to produce a filter output y.

Recursive correction of the tap gain $C_j$ is carried out through the LMS adaptive algorithm by comparing the output y of the filter with a reference signal d to generate an error signal e, multiplying the error signal e by a step size $\mu$ to generate $e\mu$ through a coefficient multiplier 5, and multiplying $e\mu$ by tap output $x_j$ through multiplier 12 in tap gain multiplying unit $2j$ shown in FIG. 2, thereby producing a correcting value $\Delta C_j = e\mu x_j$ according to the LMS algorithm.

In this divergence-suppressing adaptive filter, the present tap gain $C_j$ stored in a latch circuit 15 is multiplied by leak coefficient $\alpha$ by means of coefficient multiplier 13 in tap gain multiplying unit $2j$ shown in FIG. 2, and the resultant product $\alpha C_j$ is added to the correcting value $\Delta C_j$ by adder 14, thus resulting in a new tap gain $$C_j(n+1) = \alpha C_j(n) + \Delta C_j(n), \quad (1)$$

wherein j stands for a tap number, $\Delta C_j$ denotes a correcting value and $\alpha$ is a positive constant less than 1 which corresponds to the leak. Using this new tap gain, a corrected filter output y is constructed.

For comparison, in the ordinary adaptive filter the corrected tap gain or new tap gain $C_j(n+1)$ for tap number j is represented to be $$C_j(n+1) = C_j(n) + \Delta C_j(n) \quad (2)$$

Referring to FIG. 3, operation of the divergence-suppressing adaptive filter during one sampling period or one clock period is executed as follows: successively adding weighted tap gains $C_j x_j$ ($j=1, 2, \cdots, M$) delivered from tap gain multiplying circuit 2 to generate filter output y (step 1); comparing filter output y with reference signal d to generate error signal e (step 2); making tap number $j=1$ (step 3); generating correcting value $\Delta C_j$ from tap output $x_j$ and the, output $\mu e$ of multiplier 5 (step 4); multiplying $\alpha$ by tap gain $C_j$ stored currently in the latch circuit 15 (step 5); adding $\alpha C_j$ and $\Delta C_j$ and storing the sum in the latch circuit 15 as a new tap coefficient $C_j$ (step 6); making $j=j+1$ (step 7); judging whether or not new j is equal to or less than M (step 8); and if j is equal to or less than M, the process returns to step 4 and thereafter step 4 through 7 are repeated until j becomes more than M, at which time the processing for correcting tap gains for the sampling period ends.

Now, we will estimate the amount of operation of the steps shown in FIG. 3. Assuming that a DSP (Digital Signal Processor) is used for the recursive correction of the tap gains and that the amount of operation is proportional to the number of instructions for executing the operation, the amount of operation during one sampling period is estimated as follows (in terms of units of one instruction): Since each addition as well as each multiplication can generally be executed with one instruction in the DSP, the amount of operation (hereafter referred to as A.O.) in step 2 is 1. Further, since A.O. in each of steps 4, 5 and 6 for each tap number j is 1 and since the three steps 4–6 are repeated over $j=1$ through M, the total A.O. of the three steps during one sampling period is 3M.

In almost any DSP, one multiplication-addition operation (a combination of multiplying two numbers and subsequently adding the resultant product to another number) can be executed according to one instruction. Therefore, the total A.O. expressed in a polynomial of M terms in step 1 is M. In FIG. 3, the number in parentheses near each step represents the A.O. in the corresponding step. Steps 3, 7 and 8 are represented explicitly in the flowchart in order to indicate the software in accordance with normal practice in flowcharts. These steps, however, are not always necessary and accordingly they can be omitted by expressing steps 4, 5 and 6 for all taps ($j=1, 2, \cdots, M$) in 3M consecutive steps. Thus, the total A.O. executed by the adaptive filter during one sampling period is $M+1+3M=4M+1$. In ordinary cases M is sufficiently large to render 1 negligible, and consequently the total A.O. is virtually equal to 4M.

It is to be noted that in the conventional adaptive filter described above, the leak coefficient $\alpha$ is multiplied in every recursive step, thus allowing the A.O. to increase.

An adaptive filter and the method according to the present invention will be described below with reference to FIGS. 4 through 7.

Figure 4:
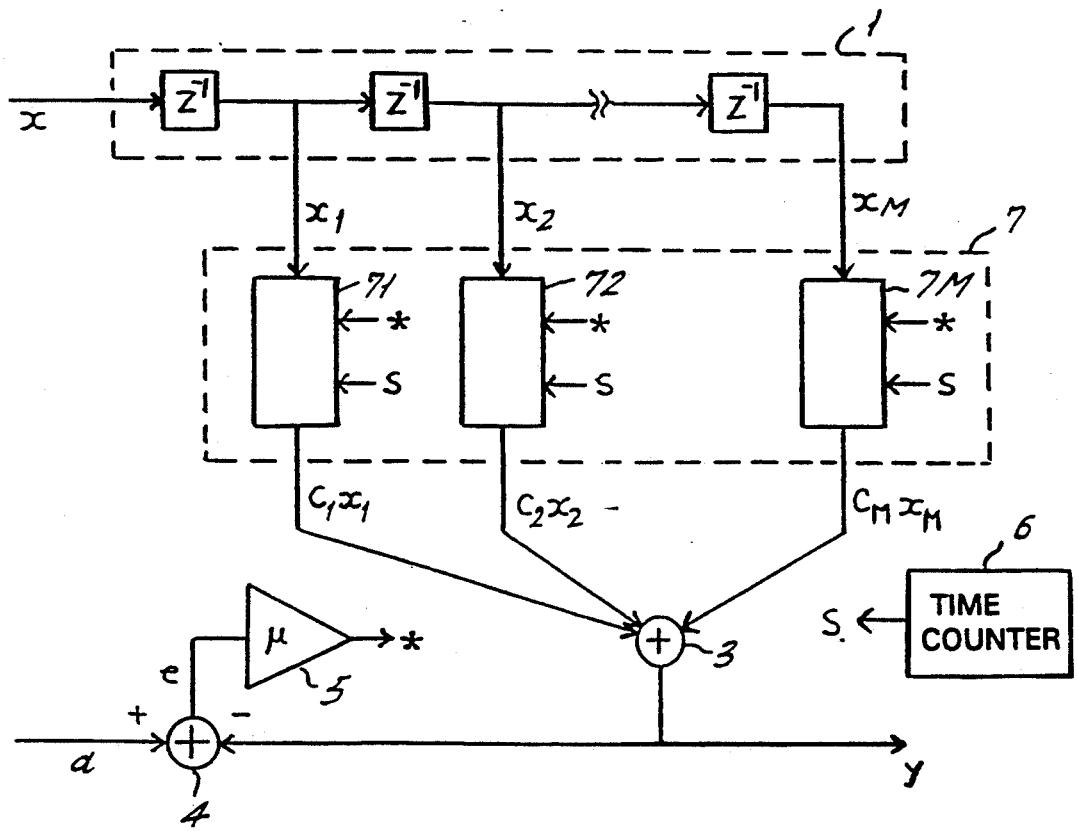
FIG. 4 is a block diagram of an adaptive filter of the recursive correction type to which the method according to the present invention is applied.
Figure 5:
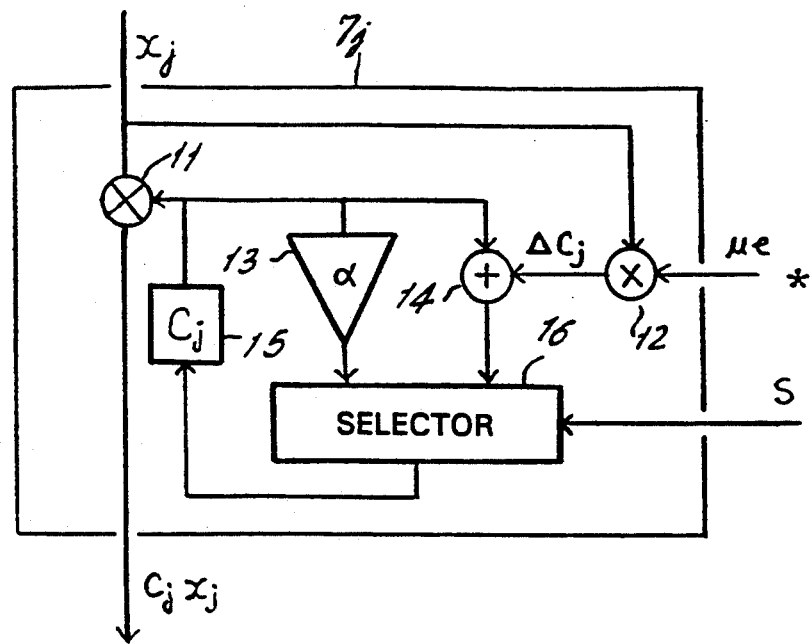
FIG. 5 is a block diagram of a tap gain multiplying unit in the adaptive filter shown in FIG. 4.
Figure 6:
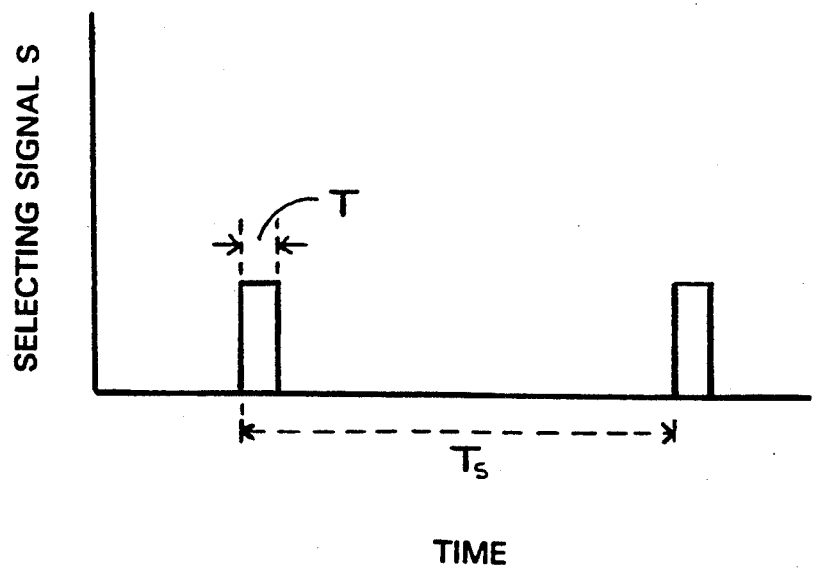
FIG. 6 is a time chart of a selecting signal shown in FIG. 5.

The adaptive filter shown in FIG. 4 is an FIR transversal adaptive filter. The adaptive filter comprises a delay line 1 provided with M tap outputs composed of an M-bit shift register, a tap gain multiplying circuit 7 for multiplying tap output signals $x_1, x_2, \ldots, x_M$ of the delay line 1 by tap gains to produce weighted tap output signals, and an adder 3 for adding the weighted tap output signals to produce a filter output signal y. Since the tap gains are corrected according to the LMS adaptive algorithm, the adaptive filter also includes a subtracter 4 for generating an error signal e which shows a difference $d-y$, and a coefficient multiplier 5 for multiplying the error signal e by the step size $\mu$. The structure described so far is basically identical with that of the conventional adaptive filter shown in FIG. 1 except for the detailed structure in the tap gain multiplying unit shown in FIG. 5.

The adaptive filter according to the present invention is additionally provided with a timer counter 6 for generating a selecting signal (see FIG. 6), and supplies the selecting signal to each tap gain multiplying unit 7j ($j=1, 2, \text{---}, M$) of the tap gain multiply circuit 7. The tap gain multiplying unit 7j comprises multipliers 11, 12, a coefficient multiplier 13, an adder 14, a latch circuit 15, and a selector 16. The latch circuit 15 stores a present tap gain $C_j$, and the multiplier 11 multiplies a tap output signal $x_j$ by the tap gain $C_j$. The coefficient multiplier 13 multiplies the tap gain $C_j$ by the leak coefficient $\alpha$, thereby producing an output signal $\alpha C_j$. The multiplier 12 multiplies a signal $\mu e$ supplied from the coefficient multiplier 5 by the tap output signal $x_j$, thereby producing a correcting value $\Delta C_j = \mu e x_j$ according to the LMS adaptive algorithm. The adder 14 adds the present tap gain $C_j$ and the correcting value $\Delta C_j$, thereby generating a corrected tap gain $C_{j+\Delta C_j}$. The selector 16 is supplied with both the output signal $\alpha C_j$ supplied from the coefficient multiplier 13 and the corrected tap gain $C_j + \Delta C_j$ supplied from the adder 14, and selects the latter during a first correction term which corresponds to a low level period in the selecting signal S shown in FIG. 6, and selects the former during a second correction term which corresponds to a high level period in the select signal S shown in FIG. 6. The selector 16 delivers the selected output signal to the latch circuit 15. The latch circuit 15 stores the signal supplied from the selector 16 as the new tap gain. The multiplier 11 multiplies the tap output signal $x_j$ from the delay line 1 by the new tap gain $C_j$ from the latch circuit 15. The adder 3 adds the weighted tap output signals supplied from the tap gain multiplying units 7j ($j=1, 2, \text{---}, M$), and outputs the sum as a corrected filter output signal y.

The first correction term, i.e., the low-level period of the selecting signal S, is determined to be long enough to allow each recursively corrected tap gain to converge to an optimum expected value in the sense of the least mean square error. As is well known in the art, according to the LMS adaptive algorithm, the rate at which the mean square error converges to a minimum is controlled by the step size $\mu$, the rate becoming higher as the step size $\mu$ increases. If the step size $\mu$ is too large, however, the recursive correction process will oscillate and become unstable. Therefore, the low-level period of the selecting signal S is determined depending on the optimum value of the step size $\mu$. The second correction term, i.e., the high-level period of the selecting signal S, is selected to be one sampling period in the illustrated embodiment. Since the duty cycle of the high-level period of the selecting signal S is relatively small, the value of the leak coefficient is determined to be small compared with that in the divergence-suppressing adaptive filter shown in FIG. 1 in order to effectively prevent the tap gain from diverging.

Operation of the adaptive filter according to the present invention will be described below with reference to FIG. 7. A filter output signal y is produced (step 1), and then subtracted from a reference signal d to produce an error signal e (step 2). Next, it is judged whether or not the present sampling period kT (represented in terms of one sampling period T and a serial number of the present sampling period k) corresponds with the start of the selecting signal period $T_s$, i.e. $T_s = kT$ (step 3). If kT is not equal to $T_s$, the present sampling period kT belongs to the low-level period of the selecting signal S, i.e. the first correction term. The tap number j is then set to 1 (step 4), and a correcting value $\Delta C_1 = \mu e x_1$ is produced (step 5). The correcting value $\Delta C_1$ is added to the present tap gain $C_1$, thereby generating a corrected tap gain $C_1 + \Delta C_1$ (step 6). Subsequently, the tap number j is set to $j+1=2$ (step 7). Next, it is judged whether or not the present tap number 2 is equal to or smaller than M. If the present tap number j is not larger than M, the program returns to step 5 and a correcting value $\Delta C_2 = \mu e x_2$ is produced. Then, a corrected tap gain $C_2 + \Delta C_2$ is produced (step 6), followed by step 7 in which the tap number j is set to $j+1=3$. In step 8, it is judged whether or not the present tap number 3 is not larger than M. The process of steps 5, 6, 7, 8 is repeated until the tap number j equals M. When the tap number j exceeds M, the first correction for the tap gains in the sampling period is finished.

If the sampling period kT is equal to the selecting signal period $T_s$ in step 3, the tap number j is set to 1 (step 9), and a new tap gain $\alpha C_1$ is generated (step 10). Subsequently, tap number j is set to $j+1=2$ (step 11). Next, it is judged whether or not the present tap number 2 is equal to or smaller than M (step 12). Steps 10, 11, 12 are repeated until the tap number j equals M. When the tap number j exceeds M, the second corrections for the tap gains in the sampling period are finished.

Steps 3, 8, 12 for judgment and steps 4, 7, 9, 11 for setting the tap number j are explicitly expressed in the flowchart shown in FIG. 7. However, steps 4, 7, 8, 9, 11 and 12 may be dispensed with for the same reason given with regard to the flowchart in FIG. 3. Step 3 may also be dispensed with by expressing consecutively steps 5 and 6 for all taps over all sampling periods in the first correction term and step 10 for all taps over all sampling periods in the second correction term. Estimating the A.O. executed in the adaptive filter in the same way as in the flowchart shown in FIG. 3, we find that the A.O. in the first correction term is $3M+1$ per sampling period, which is about 25% smaller than the A.O. $4M+1$ required for the flowchart shown in FIG. 3. The A.O. executed in the second correction term is $2M+1$ per sampling period, which is about half the A.O. for the flowchart shown in FIG. 3. Since the duty cycle of the second correction term with respect to the selecting signal period $T_s$ is markedly small, the A.O. executed in the second correction term is negligible compared with the entire A.O.

Comparing the tap gain correcting step (step 6) in FIG. 3 with step 6 in FIG. 7, it can be seen that in FIG. 3, since the sum of the tap gains multiplied by the leak coefficient $\alpha$ and the correcting value is substituted as a new tap gain for the preceding tap gain, the resultant filter output signal y should depend on the leak coefficient $\alpha$ and will not fit the reference signal d. In the present embodiment, in contrast, in the major term of a selecting signal period (i.e. during the period when kT differs from $T_s$), the tap gain is recursively corrected using a known recursive correction algorithm so that the filter output signal y converges with the reference signal d, while in the minor term of the selecting signal period (i.e. during the period when kT is equal to $T_s$), the correction to suppress the divergent behavior of tap gain $C_j$ is made in step 10, thereby producing an optimum filter output signal and preventing recursively corrected values of each tap gain from diverging.

The present invention should not be interpreted as limited to the illustrated embodiment. While the method of precluding divergent behavior in a recursively corrected adaptive filter is applied to an FIR, transversal filter in the above embodiment, the principles of the present invention may be applied to a filter which is not an FIR transversal filter insofar as the filter has impulse responses $h_0$, $h_1$, $h_2$, ... and their transfer function is expressed by $\Sigma h_j z^{-j}$. In such a modification, the impulse responses $h_j$s serve as tap gains in a wider sense.

The recursive correction algorithm may not necessarily be the LMS adaptive algorithm, but may be any desired adaptive algorithm.

Although a certain preferred embodiment of the present invention has been shown and described in detail, it should be understood that various changes and modifications may be made therein without departing from the scope of the appended claims.

What is claimed is:

1. A method for preventing divergent behavior in the tap gain of an adaptive filter by suppressing divergent tendencies in the recursively corrected values of each tap gain thereof through a conventional recursive correction algorithm, the method including the steps of:
   carrying out a first kind of correction for correcting each tap gain through the conventional recursive correction algorithm during a first correction term,
   carrying out a second kind of correction during a second correction term by multiplying the tap gain corrected during the preceding first correction term, by a constant predetermined so as to suppress divergent tendencies in recursively corrected values of each tap gain, and
   repeating the first and second kind of corrections successively,
   wherein:
   the duration of the first correction term is determined so as to be long enough to allow recursively corrected values of each tap gain to converge to a substantially optimum value, but to be short enough to permit the adaptive filter to undergo the second kind of correction before or as soon as new divergent behavior of the output of the adaptive filter starts, and
   the duration of the second correction term is determined to be equal to one sampling period of an input signal supplied to the adaptive filter.

2. A method as claimed in claim 1, wherein the value of the constant multiplied in the second kind of correction is a positive value less than 1.

3. A method as claimed in claim 1, wherein the recursive correction algorithm includes the Least Mean Square adaptive algorithm.

4. A method as claimed in claim 4, wherein the duration of the first correction term depends on the step size for the Least Mean Square adaptive algorithm.

5. An adaptive filter, each of whose tap gains is recursively adjusted so as to make the output of the adaptive filter fit a reference signal, the adaptive filter comprising:
   a correcting circuit for calculating the correcting component of each of the tap gains in accordance with a conventional recursive correction algorithm,
   an adder for adding each correcting component calculated by the correcting circuit to the corresponding tap gain,
   a coefficient multiplier for multiplying the tap gain, by a constant predetermined so as to suppress divergent tendencies in recursively corrected values of each tap gain,
   a selector for selectively outputting, as a corrected tap gain, one of the signals supplied from the adder and the coefficient multiplier, in response to a selecting signal, and
   a timer counter for periodically supplying the selecting signal to the selector.
   wherein a correcting circuit, adder, coefficient multiplier and selector are provided for each of the tap outputs, a single timer counter is provided for all tap outputs, a single timer counter is provided for all tap outputs, and a period during which the selector selects a signal supplied from the coefficient multiplier is determined to be equal to one sampling period of an input signal supplied to the adaptive filter.

6. An adaptive filter as claimed in claim 5, wherein the duration of a first correction term, in which the selector selects a signal supplied from the adder, is determined to be long enough to allow recursively corrected values of each tap gain to converge to a substantially optimum value, but to be short enough to permit a departure from the first correction term to take place before or as soon as new divergent behavior of the output of the adaptive filter starts, and the duration of a second correction term is said period during which the selector selects a signal supplied from the coefficient multiplier, and said second correction term is determined to be equal to one sampling period of an input signal supplied to the adaptive filter.

7. An adaptive filter as claimed in claim 5, wherein the value of the constant multiplied by the coefficient multiplier is a positive value less than 1.

8. An adaptive filter as claimed in claim 5, wherein the recursive correction algorithm includes the Least Mean Square adaptive algorithm.

9. An adaptive filter as claimed in claim 8, wherein the duration of the first correction term depends on the step size for the Least Mean Square adaptive algorithm.

* * * * *